United States Patent
Zhang

(10) Patent No.: US 9,530,644 B2
(45) Date of Patent: Dec. 27, 2016

(54) POLYSILICON MANUFACTURING METHOD THAT ENHANCES HOMOGENEITY OF POLYSILICON LAYER

(71) Applicant: Shenzhen China Star Optoelectronics Technology Co., Ltd., Shenzhen, Guangdong (CN)

(72) Inventor: Xiang Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 209 days.

(21) Appl. No.: 14/235,742

(22) PCT Filed: Nov. 18, 2013

(86) PCT No.: PCT/CN2013/087360
§ 371 (c)(1),
(2) Date: Jan. 28, 2014

(87) PCT Pub. No.: WO2015/070464
PCT Pub. Date: May 21, 2015

(65) Prior Publication Data
US 2015/0380245 A1  Dec. 31, 2015

(30) Foreign Application Priority Data
Nov. 12, 2013 (CN) .......................... 2013 1 0561925

(51) Int. Cl.
*H01L 21/02* (2006.01)
*H01L 21/66* (2006.01)
(Continued)

(52) U.S. Cl.
CPC ... *H01L 21/02675* (2013.01); *H01L 21/02068* (2013.01); *H01L 21/02422* (2013.01);
(Continued)

(58) Field of Classification Search
CPC ............... H01L 21/02675; H01L 21/02488; H01L 21/32134; H01L 21/02592; H01L 21/02068; H01L 21/32055; H01L 22/20; H01L 22/12; H01L 21/02422; H01L 21/02532; H01L 438/14; H01L 22/00; G01B 2210/56; H01S 5/0014
See application file for complete search history.

(56) References Cited

U.S. PATENT DOCUMENTS

2002/0034845 A1* 3/2002 Fujimura ............ H01L 21/2026
438/166
2005/0000940 A1   1/2005 Iwamoto
(Continued)

FOREIGN PATENT DOCUMENTS

CN  101236898 A  8/2008
CN  101996869 A  3/2011
(Continued)

*Primary Examiner* — Julio J Maldonado
*Assistant Examiner* — Stanetta Isaac
(74) *Attorney, Agent, or Firm* — Andrew C. Cheng

(57) ABSTRACT

The present invention provides a polysilicon manufacturing method that enhances homogeneity of a polysilicon layer, including (1) forming a amorphous silicon layer (30) on a substrate (10); (2) dividing the amorphous silicon layer (30) into a plurality of areas and measuring a film thickness of the amorphous silicon layer (30) in each of the areas: (3) comparing the measured film thickness of each of the areas with a predetermined film thickness so as to identify and define ones of the areas of which the measured film thicknesses are greater than a predetermined film thickness as excessive-film-thickness areas (42); (4) spraying an etchant liquid to rinse the amorphous silicon layer (30) of the excessive-film-thickness areas (42) in order to etch off a portion of the amorphous silicon layer (30) of each of the excessive-film-thickness areas (42) and at the same time, spraying pure water to rinse remaining ones of the areas so
(Continued)

as to make the film thickness of each of the areas of the amorphous silicon layer (30') consistent with each other; and (5) applying a laser annealing operation to the rinsed amorphous silicon layer (30') so as to cause crystallization of the amorphous silicon layer (30') to form a polysilicon layer (60).

14 Claims, 5 Drawing Sheets

(51) Int. Cl.
    *H01L 21/3205*     (2006.01)
    *H01L 21/3213*     (2006.01)

(52) U.S. Cl.
    CPC .. *H01L 21/02488* (2013.01); *H01L 21/02532* (2013.01); *H01L 21/02592* (2013.01); *H01L 21/32055* (2013.01); *H01L 21/32134* (2013.01); *H01L 22/12* (2013.01); *H01L 22/20* (2013.01)

(56) References Cited

U.S. PATENT DOCUMENTS

| | | | |
|---|---|---|---|
| 2009/0156018 | A1 | 6/2009 | You |
| 2010/0129941 | A1* | 5/2010 | Okita ............... H01L 21/30604 438/16 |
| 2012/0205659 | A1* | 8/2012 | Lee ..................... H01L 27/1218 257/72 |

FOREIGN PATENT DOCUMENTS

| | | |
|---|---|---|
| CN | 102978590 A | 3/2013 |
| CN | 103123902 A | 5/2013 |
| CN | 103219230 A | 7/2013 |
| CN | 103325665 A | 9/2013 |
| CN | 102709160 A | 10/2013 |
| WO | WO2005029550 A2 | 3/2005 |

* cited by examiner

POLYSILICON MANUFACTURING METHOD THAT ENHANCES HOMOGENEITY OF POLYSILICON LAYER

BACKGROUND OF THE INVENTION

1. Field of the Invention

The present invention relates to the field of displaying technology, and in particular to a polysilicon manufacturing method that enhances homogeneity of polysilicon layer.

2. The Related Arts

The displaying technology has been under fast development recently. A flat panel display device is significantly different from a traditional video image displaying device by adopting totally different displaying and manufacturing technology. The traditional video image displaying device is generally based on a cathode ray tube (CRT), from which a flat panel display device differs primarily concerning changes made in respect of weight and size (thickness). Generally, a flat panel display device has a thickness not greater than 10 centimeters, among the other differences associated with various technical aspects, such as theory of displaying, manufacturing material, manufacturing process, driving for displaying video images.

The flat panel display device possesses features such as being completely flattened, being light and thin, and energy saving and currently undergoes progresses toward high PPI (pixels per inch), low power consumption, and high integration. Amorphous silicon, which is conventionally used, due to inherent limitation, cannot suit the above described needs and polysilicon is considered the best candidate for substituting amorphous silicon for polysilicon is fit for the needs for future developments of the flat panel display device. Thus, low-temperature polysilicon (LTPS) displaying technology has become a new favorite of the displaying field.

As links of the technical cores of the low temperature polysilicon displaying technology, the manufacturing process and material behavior of polysilicon determine the performance of a display device. The manufacturing processes of polysilicon that are currently known include: low pressure chemical vapor deposition (LPCVD), solid phase crystallization, metal induction, and laser annealing. The most commonly used process in the industry is the laser annealing operation, which uses the high temperature generated by a laser beam to melt amorphous silicon for re-crystallization to form polysilicon. Although adjusting parameters of the laser beam may better the result of crystallization, the grain size and homogeneity of the annealed polysilicon are not only determined by the parameters of the laser beam; and the thickness of the chemical vapor deposition (CVD) film and the condition of rinsing with hydrogen fluoride (HF) may also impose influence on the final result of the laser annealing.

Referring to FIG. 1, a schematic view is given to illustrate the process flow of a conventional way of processing an amorphous silicon layer with laser annealing, wherein an amorphous silicon layer 100, which is of poor homogeneity (for having localized areas 102 of excessive film thickness), is only subjected to rinsing by spraying hydrogen fluoride 200 so that after the rinsing operation, a polysilicon layer 300 formed through laser annealing is obtained, but similarly presenting the issue of homogeneity.

SUMMARY OF THE INVENTION

An object of the present invention is to provide a polysilicon manufacturing method that enhances homogeneity of a polysilicon layer, wherein a rinsing unit is used to perform localized etching on a film thickness enlarged area of an amorphous silicon layer so as to enhance the homogeneity of the polysilicon layer obtained through laser annealing.

To achieve the object, the present invention provides a polysilicon manufacturing method that enhances homogeneity of a polysilicon layer, comprising the following steps:

(1) forming an amorphous silicon layer on a substrate;

(2) dividing the amorphous silicon layer into a plurality of areas and measuring a film thickness of the amorphous silicon layer in each of the areas;

(3) comparing the measured film thickness of each of the areas with a predetermined film thickness so as to identify and define ones of the areas of which the measured film thicknesses are greater than the predetermined film thickness as excessive-film-thickness areas;

(4) spraying an etchant liquid to rinse the amorphous silicon layer of the excessive-film-thickness areas in order to etch off a portion of the amorphous silicon layer of each of the excessive-film-thickness areas and at the same time, spraying pure water to rinse remaining ones of the areas so as to make the film thickness of each of the areas of the amorphous silicon layer consistent with each other; and (5) applying a laser annealing operation to the rinsed amorphous silicon layer so as to cause crystallization of the amorphous silicon layer to form a polysilicon layer.

Step (1) further comprises forming a buffer layer on the substrate through deposition so that the amorphous silicon layer is subsequently formed on the buffer layer.

The buffer layer is formed by sequentially depositing a silicon nitride and a silicon oxide.

In step (2), a thickness measurement device is used to measure the film thickness of the amorphous silicon layer of each of the areas. The thickness measurement device comprises a predetermined film thickness built therein in advance.

In step (4), a rinsing unit is used to rinse the amorphous silicon layer. The rinsing unit comprises: a plurality of mutually parallel etchant liquid pipes and a plurality of mutually parallel pure water pipes. The plurality of etchant liquid pipes is substantially perpendicular to the plurality of pure water pipes. The plurality of etchant liquid pipes has a side adjacent to the amorphous silicon layer and provided with a plurality of nozzles. The plurality of pure water pipes has a side adjacent to the amorphous silicon layer and provided with a plurality of nozzles.

The etchant liquid comprises hydrogen fluoride.

In step (5), the laser annealing operation applied to the rinsed amorphous silicon layer comprises applying a laser to irradiate the rinsed amorphous silicon layer.

The laser has a wavelength of 308 nm.

The substrate comprises a glass substrate.

The substrate comprises a plastic substrate.

The present invention also provides a polysilicon manufacturing method that enhances homogeneity of a polysilicon layer, comprising the following steps:

(1) forming an amorphous silicon layer on a substrate;

(2) dividing the amorphous silicon layer into a plurality of areas and measuring a film thickness of the amorphous silicon layer in each of the areas;

(3) comparing the measured film thickness of each of the areas with a predetermined film thickness so as to identify and define ones of the areas of which the measured film thicknesses are greater than the predetermined film thickness as excessive-film-thickness areas;

(4) spraying an etchant liquid to rinse the amorphous silicon layer of the excessive-film-thickness areas in order to etch off a portion of the amorphous silicon layer of each of the excessive-film-thickness areas and at the same time, spraying pure water to rinse remaining ones of the areas so as to make the film thickness of each of the areas of the amorphous silicon layer consistent with each other; and (5) applying a laser annealing operation to the rinsed amorphous silicon layer so as to cause crystallization of the amorphous silicon layer to form a polysilicon layer;

wherein step (1) further comprises forming a buffer layer on the substrate through deposition so that the amorphous silicon layer is subsequently formed on the buffer layer;

wherein the buffer layer is formed by sequentially depositing a silicon nitride and a silicon oxide;

wherein in step (2), a thickness measurement device is used to measure the film thickness of the amorphous silicon layer of each of the areas, the thickness measurement device comprising a predetermined film thickness built therein in advance;

wherein in step (4), a rinsing unit is used to rinse the amorphous silicon layer, the rinsing unit comprising: a plurality of mutually parallel etchant liquid pipes and a plurality of mutually parallel pure water pipes, the plurality of etchant liquid pipes being substantially perpendicular to the plurality of pure water pipes, the plurality of etchant liquid pipes having a side adjacent to the amorphous silicon layer and provided with a plurality of nozzles, the plurality of pure water pipes having a side adjacent to the amorphous silicon layer and provided with a plurality of nozzles; and wherein the etchant liquid comprises hydrogen fluoride.

In step (5), the laser annealing operation applied to the rinsed amorphous silicon layer comprises applying a laser to irradiate the rinsed amorphous silicon layer.

The laser has a wavelength of 308 nm.

The substrate comprises a glass substrate.

The substrate comprises a plastic substrate.

The efficacy of the present invention is that the present invention provides a polysilicon manufacturing method that enhances homogeneity of a polysilicon layer, wherein a thickness measurement device is used to measure a film thickness of each of areas of an amorphous silicon layer in order to identify excessive-film-thickness areas and a rinsing unit is used to supply an etchant liquid to rinse the amorphous silicon layer of the excessive-film-thickness areas for etching off a portion of the amorphous silicon layer of each of the excessive-film-thickness areas and at the same time supplying pure water to rinse the remaining ones of the areas so as to make the film thickness of each part of the amorphous silicon layer consistent with each other to enhance the homogeneity of a polysilicon layer obtained therefrom through laser annealing.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
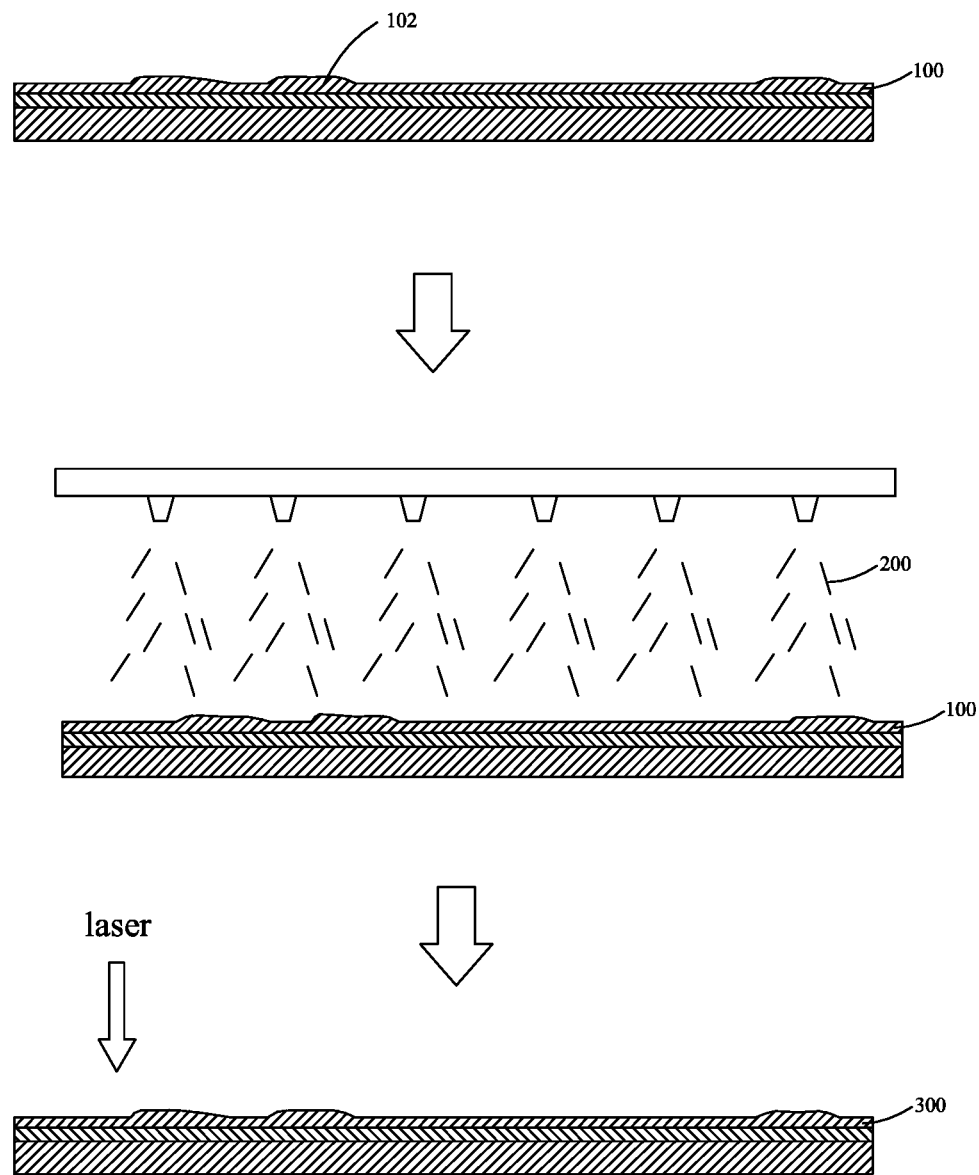
FIG. 1 is a schematic view illustrating a process flow of a conventional way for processing an amorphous silicon layer with laser annealing.
Figure 2:
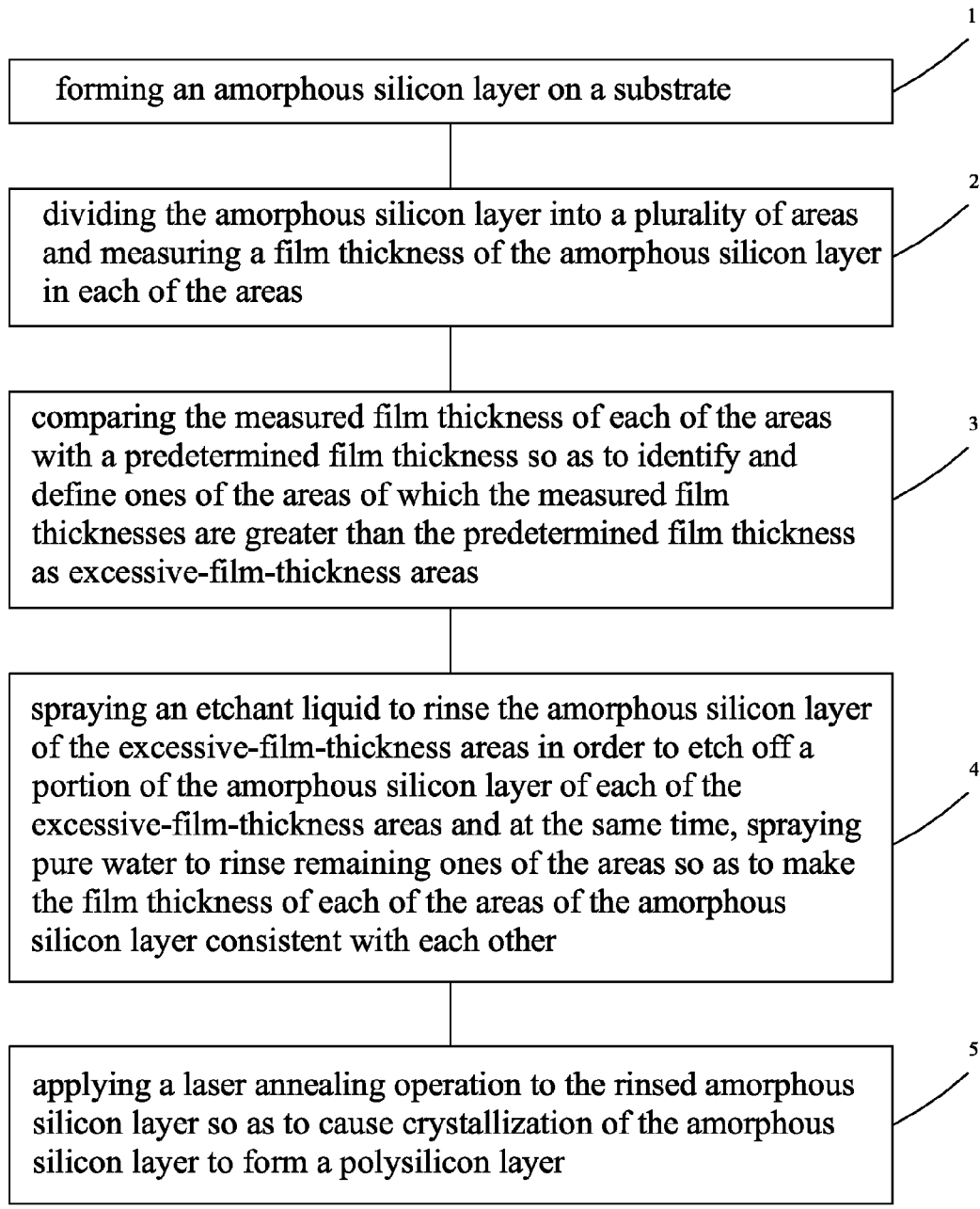
FIG. 2 is a flow chart illustrating a polysilicon manufacturing method that enhances homogeneity of a polysilicon layer according to the present invention.
Figure 3:
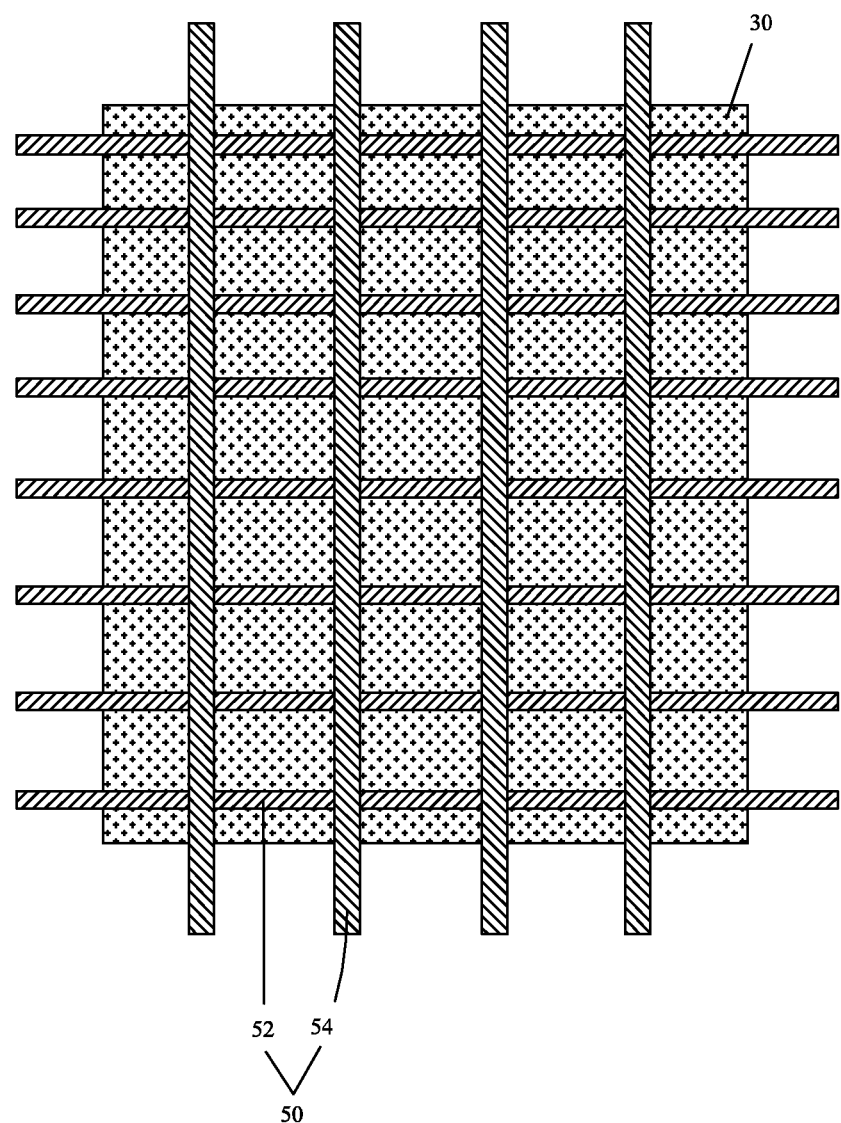
FIG. 3 is a schematic view showing a structure of a rinsing unit according to the present invention.
Figure 4:
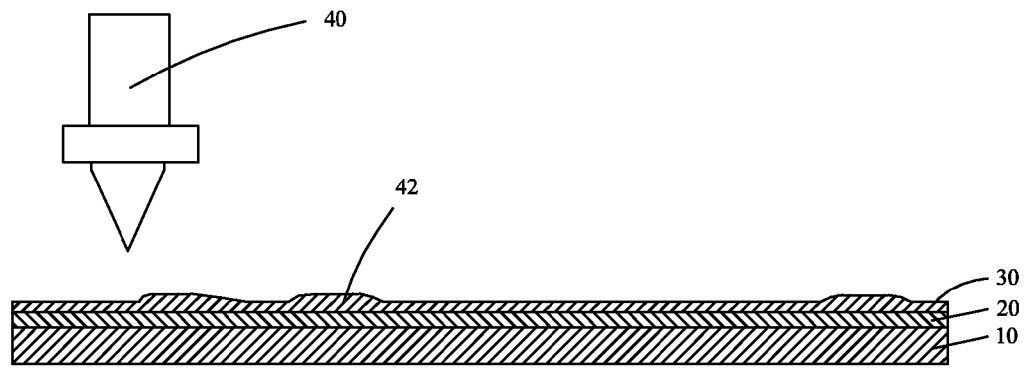
FIG. 4 is a schematic view illustrating a thickness measurement device measuring a film thickness of an amorphous silicon layer according to the present invention.
Figure 5:
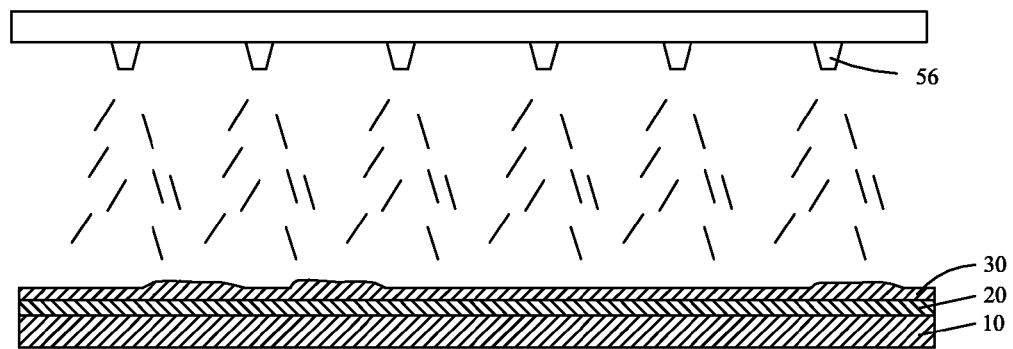
FIG. 5 is a schematic view illustrating the rinsing unit rinsing an amorphous silicon layer according to the present invention.
Figure 6:
FIG. 6 is a schematic view showing a rinsed amorphous silicon layer according to the present invention.
Figure 7:
FIG. 7 is a schematic view illustrating a laser annealing operation applied to the rinsed amorphous silicon layer according the present invention.

Referring to FIGS. 2-7, the present invention provides a polysilicon manufacturing method that enhances homogeneity of a polysilicon layer, comprising the followings steps:

Step 1: forming an amorphous silicon layer 30 on a substrate 10.

The step may further comprise forming a buffer layer 20 on the substrate 10 through deposition so that the amorphous silicon layer 30 is subsequently formed on the buffer layer 20.

The buffer layer 20 and the amorphous silicon layer 30 can be formed through deposition under any known operation conditions. The buffer layer 20 is formed by sequentially depositing a silicon nitride and a silicon oxide.

Step 2: dividing the amorphous silicon layer 30 into a plurality of areas and measuring a film thickness of the amorphous silicon layer 30 in each of the areas.

In the step, a thickness measurement device 40 is used to measure the film thickness of the amorphous silicon layer 30 of each of the areas. The thickness measurement device 40 comprises a predetermined film thickness built therein in advance.

The instant embodiment allows for early division of the amorphous silicon layer 30 into a plurality of areas for measurement. The larger the number of the divided areas is, the better the homogeneity of a finally obtained polysilicon layer 60 will be. In the instant embodiment, in order to increase the efficiency of measurement and also to ensure the quality of measurement, it is preferred to divide the amorphous silicon layer 30 into 16 or 32 areas for measurement.

Step 3: comparing the measured film thickness of each of the areas with a predetermined film thickness so as to identify and define ones of the areas of which the measured film thicknesses are greater than the predetermined film thickness as excessive-film-thickness areas 42.

The film thickness that is measured for each of the areas is compared with an average film thickness that is stored in advance in the thickness measurement device 40 and the areas of which the film thicknesses exceed the predetermined film thickness are identified and defined as the excessive-film-thickness areas 42.

Step 4: spraying an etchant liquid to rinse the amorphous silicon layer 30 of the excessive-film-thickness areas 42 in order to etch off a portion of the amorphous silicon layer 30 of each of the excessive-film-thickness areas 42 and at the same time, spraying pure water to rinse remaining ones of the areas so as to make the film thickness of each of the areas of the amorphous silicon layer 30 consistent with each other.

In the step, a rinsing unit 50 is used to rinse the amorphous silicon layer 30. The rinsing unit 50 comprises: a plurality of mutually parallel etchant liquid pipes 52 and a plurality of mutually parallel pure water pipes 54. The plurality of etchant liquid pipes 52 is substantially perpendicular to the plurality of pure water pipes 54. The plurality of etchant liquid pipes 52 each has a side adjacent to the amorphous silicon layer 30 and provided with a plurality of nozzles 56, wherein the nozzles 56 can be automatically opened or closed to control the spraying of the etchant liquid; similarly, the plurality of pure water pipes 54 each has a side adjacent to the amorphous silicon layer 30 and provided with a plurality of nozzles 56, wherein the nozzles 56 can also be automatically opened or closed to control the spraying of pure water. Thus, it is possible to make a control so that the etchant liquid can be sprayed independently and individually to rinse the amorphous silicon layer 30 of the excessive-film-thickness areas 42 for etching off a portion of the amorphous silicon layer 30 of each of the excessive-film-thickness areas 42, while at the same time, pure water is sprayed to the remaining ones of the areas to carry out rinsing in such a way as to suppress spreading of the etchant liquid from the excessive-film-thickness areas 42 to the remaining areas, thereby making the film thickness of each part of the rinsed amorphous silicon layer 30' consistent with each other. In the instant embodiment, the etchant liquid used is hydrogen fluoride.

Step 5: applying a laser annealing operation to the rinsed amorphous silicon layer 30' so as to cause crystallization of the amorphous silicon layer 30' to form a polysilicon layer 60.

The laser annealing operation described above applies a laser 70 to irradiate the rinsed amorphous silicon layer 30. The laser 70 preferably has a wavelength of 308 nm.

Before the laser annealing operation is applied, the rinsing operation is carried out with the rinsing unit 50 in the above described manner in order to have the film thickness of each part of the rinsed amorphous silicon layer 30' consistent with each other so that after the application of the laser annealing treatment, the polysilicon layer 60 so obtain presents homogeneity that is superior to the homogeneity of a polysilicon layer that is processed with known techniques.

In summary, the present invention provides a polysilicon manufacturing method that enhances homogeneity of a polysilicon layer, wherein a thickness measurement device is used to measure a film thickness of each of areas of an amorphous silicon layer in order to identify excessive-film-thickness areas and a rinsing unit is used to supply an etchant liquid to rinse the amorphous silicon layer of the excessive-film-thickness areas for etching off a portion of the amorphous silicon layer of each of the excessive-film-thickness areas and at the same time supplying pure water to rinse the remaining ones of the areas so as to make the film thickness of each part of the amorphous silicon layer consistent with each other to enhance the homogeneity of a polysilicon layer obtained therefrom through laser annealing.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A polysilicon manufacturing method that enhances homogeneity of a polysilicon layer, comprising the following steps:
   (1) forming an amorphous silicon layer on a substrate;
   (2) dividing the amorphous silicon layer into a plurality of areas and measuring a film thickness of the amorphous silicon layer in each of the areas with a thickness measurement device that comprises a predetermined fixed value of thickness built therein in advance;
   (3) comparing the measured film thickness of each of the areas with the predetermined fixed value so as to identify and define ones of the areas of which the measured film thicknesses are greater than the predetermined fixed value of thickness as excessive-film-thickness areas, while the remaining ones of the areas have thicknesses that are not greater than the predetermined fixed value of thickness and are defined as non-excessive-film-thickness areas;
   (4) spraying an etchant liquid directly on the amorphous silicon layer of the excessive-film-thickness areas in the entirety of each of the excessive-film-thickness areas to rinse the amorphous silicon layer of the excessive-film-thickness areas in order to etch off a portion of the amorphous silicon layer of each of the excessive-film-thickness areas and thus remove the portion of the amorphous silicon layer of the excessive film-thickness area and at the same time, spraying pure water to rinse the non-excessive-film-thickness areas in the entirety of each of the non-excessive-film-thickness areas so as to make the film thickness of each of the areas of the amorphous silicon layer consistent with each other and corresponding to the predetermined fixed value; and
   (5) applying a laser annealing operation to the rinsed amorphous silicon layer so as to cause crystallization of the amorphous silicon layer to form a polysilicon layer.

2. The polysilicon manufacturing method that enhances homogeneity of a polysilicon layer as claimed in claim 1, wherein step (1) further comprises forming a buffer layer on the substrate through deposition so that the amorphous silicon layer is subsequently formed on the buffer layer.

3. The polysilicon manufacturing method that enhances homogeneity of a polysilicon layer as claimed in claim 2, wherein the buffer layer is formed by sequentially depositing a silicon nitride and a silicon oxide.

4. The polysilicon manufacturing method that enhances homogeneity of a polysilicon layer as claimed in claim 1, wherein in step (4), a rinsing unit is used to rinse the amorphous silicon layer, the rinsing unit comprising: a plurality of mutually parallel etchant liquid pipes that are generally parallel to the amorphous silicon layer and a plurality of mutually parallel pure water pipes that are generally parallel to the amorphous silicon layer, the plurality of etchant liquid pipes being substantially perpendicular to the plurality of pure water pipes to form a grating arrangement, the plurality of etchant liquid pipes having a side adjacent to the amorphous silicon layer and provided with a plurality of nozzles that face the amorphous silicon layer, the plurality of pure water pipes having a side adjacent to the amorphous silicon layer and provided with a plurality of nozzles that face the amorphous silicon layer.

5. The polysilicon manufacturing method that enhances homogeneity of a polysilicon layer as claimed in claim 4, wherein the etchant liquid comprises hydrogen fluoride.

6. The polysilicon manufacturing method that enhances homogeneity of a polysilicon layer as claimed in claim 1, wherein in step (5), the laser annealing operation applied to the rinsed amorphous silicon layer comprises applying a laser to irradiate the rinsed amorphous silicon layer.

7. The polysilicon manufacturing method that enhances homogeneity of a polysilicon layer as claimed in claim 6, wherein the laser has a wavelength of 308 nm.

8. The polysilicon manufacturing method that enhances homogeneity of a polysilicon layer as claimed in claim 1, wherein the substrate comprises a glass substrate.

9. The polysilicon manufacturing method that enhances homogeneity of a polysilicon layer as claimed in claim 1, wherein the substrate comprises a plastic substrate.

10. A polysilicon manufacturing method that enhances homogeneity of a polysilicon layer, comprising the following steps:
  (1) forming an amorphous silicon layer on a substrate;
  (2) dividing the amorphous silicon layer into a plurality of areas and measuring a film thickness of the amorphous silicon layer in each of the areas with a thickness measurement device that comprises a predetermined fixed value of thickness built therein in advance;
  (3) comparing the measured film thickness of each of the areas with the predetermined fixed value of thickness so as to identify and define ones of the areas of which the measured film thicknesses are greater than the predetermined fixed value of thickness as excessive-film-thickness areas, while the remaining ones of the areas have thicknesses that are not greater than the predetermined fixed value of thickness and are defined as non-excessive-film-thickness areas;
  (4) spraying an etchant liquid directly on the amorphous silicon layer of the excessive-film-thickness areas in the entirety of each of the excessive-film-thickness areas to rinse the amorphous silicon layer of the excessive-film-thickness areas in order to etch off a portion of the amorphous silicon layer of each of the excessive-film-thickness areas and thus remove the portion of the amorphous silicon layer of the excessive film-thickness area and at the same time, spraying pure water to rinse the non-excessive-film-thickness areas in the entirety of each of the non-excessive-film-thickness areas so as to make the film thickness of each of the areas of the amorphous silicon layer consistent with each other and corresponding to the predetermined fixed value; and
  (5) applying a laser annealing operation to the rinsed amorphous silicon layer so as to cause crystallization of the amorphous silicon layer to form a polysilicon layer;
  wherein step (1) further comprises forming a buffer layer on the substrate through deposition so that the amorphous silicon layer is subsequently formed on the buffer layer;
  wherein the buffer layer is formed by sequentially depositing a silicon nitride and a silicon oxide;
  wherein in step (4), a rinsing unit is used to rinse the amorphous silicon layer, the rinsing unit comprising: a plurality of mutually parallel etchant liquid pipes that are generally parallel to the amorphous silicon layer and a plurality of mutually parallel pure water pipes that are generally parallel to the amorphous silicon layer, the plurality of etchant liquid pipes being substantially perpendicular to the plurality of pure water pipes to form a grating arrangement, the plurality of etchant liquid pipes having a side adjacent to the amorphous silicon layer and provided with a plurality of nozzles that face the amorphous silicon layer to spray the etchant liquid to the amorphous silicon layer, the plurality of pure water pipes having a side adjacent to the amorphous silicon layer and provided with a plurality of nozzles that face the amorphous silicon layer to spray pure water to the amorphous silicon layer; and
  wherein the etchant liquid comprises hydrogen fluoride.

11. The polysilicon manufacturing method that enhances homogeneity of a polysilicon layer as claimed in claim 10, wherein in step (5), the laser annealing operation applied to the rinsed amorphous silicon layer comprises applying a laser to irradiate the rinsed amorphous silicon layer.

12. The polysilicon manufacturing method that enhances homogeneity of a polysilicon layer as claimed in claim 11, wherein the laser has a wavelength of 308 nm.

13. The polysilicon manufacturing method that enhances homogeneity of a polysilicon layer as claimed in claim 10, wherein the substrate comprises a glass substrate.

14. The polysilicon manufacturing method that enhances homogeneity of a polysilicon layer as claimed in claim 10, wherein the substrate comprises a plastic substrate.

* * * * *